United States Patent
Oka et al.

[11] Patent Number: 6,020,048
[45] Date of Patent: Feb. 1, 2000

[54] THICK FILM CIRCUIT BOARD AND METHOD OF FORMING WIRE BONDING ELECTRODE THEREON

[75] Inventors: Kengo Oka, Nukata-gun; Takashi Nagasaka, Anjo, both of Japan

[73] Assignee: Denso Corporation, Kariya, Japan

[21] Appl. No.: 08/941,740

[22] Filed: Oct. 1, 1997

[30] Foreign Application Priority Data

Oct. 2, 1996 [JP] Japan ................................. 8-262178

[51] Int. Cl.⁷ .................................................. B32B 3/00
[52] U.S. Cl. .................... 428/209; 174/257; 174/260; 174/261; 361/771; 428/901
[58] Field of Search ........................... 428/209; 174/256, 174/260, 261, 257; 361/771

[56] References Cited

U.S. PATENT DOCUMENTS

| | | | |
|---|---|---|---|
| 4,521,476 | 6/1985 | Asai et al. | 428/209 |
| 4,581,279 | 4/1986 | Sugishita et al. | 428/209 |
| 4,993,148 | 2/1991 | Adachi et al. | 174/260 |
| 5,006,167 | 4/1991 | Morikawa et al. | 106/1.18 |
| 5,601,675 | 2/1997 | Hoffmeyer et al. | 428/901 |
| 5,709,927 | 1/1998 | Miyuse et al. | 428/209 |

FOREIGN PATENT DOCUMENTS

| | | |
|---|---|---|
| 59-058848 | 4/1984 | Japan . |
| 59-217686 | 12/1984 | Japan . |
| 60-068689 | 4/1985 | Japan . |
| 61-258439 | 11/1986 | Japan . |
| 2-250392 | 10/1990 | Japan . |

*Primary Examiner*—Deborah Jones
*Assistant Examiner*—Cathy F. Lam
*Attorney, Agent, or Firm*—Pillsbury Madison & Sutro LLP

[57] ABSTRACT

A gold (Au) thick film land constituting a wire bonding electrode is formed by printing and sintering a gold (Au) thick film paste previously added with copper (Cu) to overlap with a copper (Cu) thick film which is formed as a wiring layer on a ceramic substrate. A semiconductor part mounted on the substrate and the gold (Au) thick film land are directly connected by a gold (Au) wire thereby electrically connecting the semiconductor part and the copper (Cu) thick film. In forming the gold (Au) thick film land, the gold (Au) thick film paste previously added with copper (Cu) is used. Therefore, disconnection caused by the Kirkendoll phenomenon is restrained and stable bonding between the copper (Cu) wiring layer and the gold (Au) thick film land can be achieved.

29 Claims, 6 Drawing Sheets

PRIOR ART

FIG. 9A

PRIOR ART

THICK FILM CIRCUIT BOARD AND METHOD OF FORMING WIRE BONDING ELECTRODE THEREON

CROSS REFERENCE TO RELATED APPLICATION

This application is based upon and claims the benefit of priority of prior Japanese Patent Application No. H. 8-262178 filed on Oct. 2, 1996, the contents of which are incorporated herein by reference.

BACKGROUND OF THE INVENTION

1. Field of the Invention

The present invention relates to a thick film circuit board and a method of forming a wire bonding electrode thereon, particularly to a preferable substrate structure of a thick film circuit board where a gold (Au) wire are used as a bonding wire and a method of forming a wire bonding electrode for the gold wire.

2. Description of Related Art

According to a thick film circuit board used, for example, in an IC igniter, an IC regulator or the like of an engine control device, conductive wiring layers are normally printed and sintered on an insulating substrate such as a ceramic substrate or the like. Thick-film resistors each having a desired sheet resistance value are printed and sintered among the wiring layers thereby forming a thick film circuit. Thereafter, glass is printed and sintered as a protective film on the thick film circuit thus formed, as necessary. Finally, a processing of adjusting the resistances of the thick-film resistors to desired resistance values is performed by laser trimming.

In such a thick film circuit board, wiring layers comprising silver (Ag) have mainly been used as the conductive wiring layers. The reason is that silver (Ag) per se is excellent in workability and electric performance. Above all, silver was used significantly owing to the fact that the material of the thick film resistor was only a material, such as ruthenium oxide ($RuO_2$), which could not be sintered under a nitrogen atmosphere. Further, ruthenium oxide ($RuO_2$) per se is provided with an extremely excellent performance as the thick film resistor material.

However, in recent years, a thick film resistor material of tin oxide ($SnO_2$) family or lanthanum boride ($LaB_6$) family which can be sintered under a nitrogen atmosphere has newly been developed and wiring layers comprising further inexpensive copper (Cu) have mainly been used as the conductive wiring layers. The thick film resistor made of tin oxide ($SnO_2$) family or lanthanum boride ($LaB_6$) family has an extremely excellent performance as a resistor. Furthermore, in forming thick films, the thick films as well as copper (Cu) wiring layers can be sintered under a nitrogen atmosphere and therefore, the workability of a thick film circuit board as a whole is extremely excellent.

As mentioned above, in a thick film circuit board in recent years, a material of tin oxide ($SnO_2$) family or lanthanum boride ($LaB_6$) family is mainly used for a thick film resistor and a wiring layer comprising a copper (Cu) thick film is mainly used as a conductive wiring layer.

In mounting a semiconductor part on the insulating substrate of such a thick film circuit board, the mounted semiconductor part needs to be electrically connected to the conductive wiring layer through some means. As one of methods for electrically connecting the semiconductor parts with the conductive wiring layers, there is connection by wire bonding. In connection by wire bonding, it is regarded as the most preferable in view of reliability to use a gold (Au) wire as a bonding wire. Incidentally, it is known that when the gold (Au) wire is used as a bonding wire, even if diameter of the wire is reduced as fine as substantially 30 through 50 μm, the wire is difficult to be cut up and further, even if the wire is brought under the severe environment such as high temperature or the like, its bonding performance is not deteriorated but rather improved.

However, the gold (Au) wire cannot directly be bonded to the copper (Cu) wiring layer which has been used in recent years as the conductive wiring layer. Accordingly, when the gold (Au) wire is used as a bonding wire, it is necessary to provide a land comprising a gold (Au) thick film also on the side of the insulating substrate in order to obtain a high reliable bonding. However, if all the conductive wiring layers on the board are formed by the gold (Au) thick film, there arises a problem that cost of the thick film circuit board increases, which is not preferable.

Figure 9A:
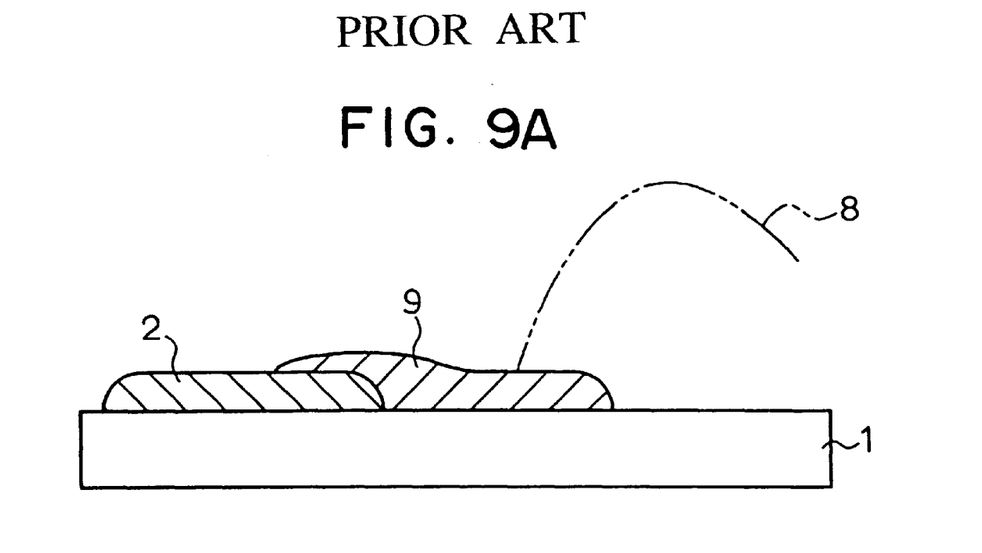
FIGS. 9A and 9B are schematic sectional views showing a mode of electrode disconnection caused by the Kirkendoll phenomenon.

For that reason, as exemplified in FIG. 9A, it is conceivable that a gold (Au) thick film land 9 partially overlaps with a copper (Cu) wiring layer 2 that is formed as a thick film on an insulating substrate 1 of a ceramic substrate or the like film and a gold (Au) wire 8 is bonded to the gold (Au) thick film land 9.

Figure 9B:
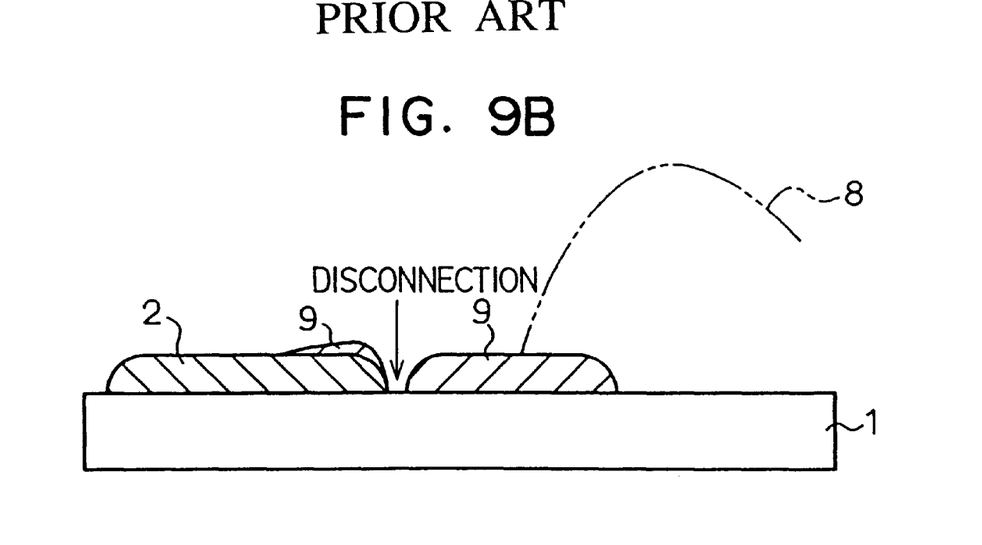

However, in this case, it has been confirmed by the inventors that in the process of forming the gold (Au) thick film land 9, specifically in the process of printing gold (Au) thick film paste by a mode shown by FIG. 9A, drying it and thereafter, sintering it at temperatures of 600° C. or higher, the gold (Au) thick film is cut up and disconnected from the copper (Cu) wiring layer 2 at an end of the copper (Cu) wiring layer 2 in a mode shown by FIG. 9B. This is presumed to be caused by the Kirkendoll phenomenon which occurs when gold (Au) in the gold (Au) thick film paste rapidly diffuses to the copper (Cu) thick film portion forming the copper (Cu) wiring layer 2. The Kirkendoll phenomenon is a phenomenon in which when two different metals are bonded by mutual diffusion, if there is a difference in diffusion coefficients inherent to the respective metal materials, cavities are caused on the side of a metal material having a larger value of the diffusion coefficient.

Figure 10A:
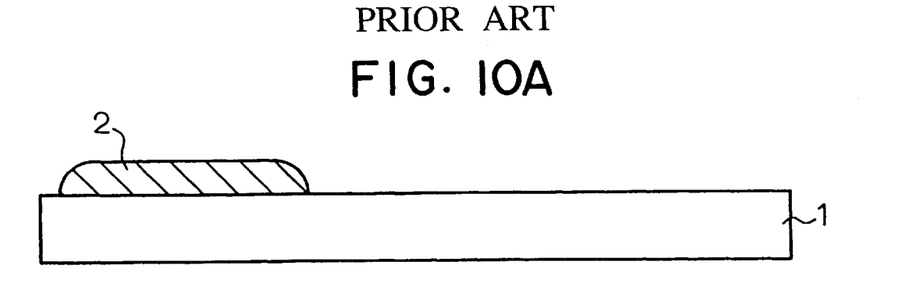
FIGS. 10A to 10C are schematic sectional views showing an example of a conventional thick film circuit board and a fabrication process thereof.
Figure 10B:
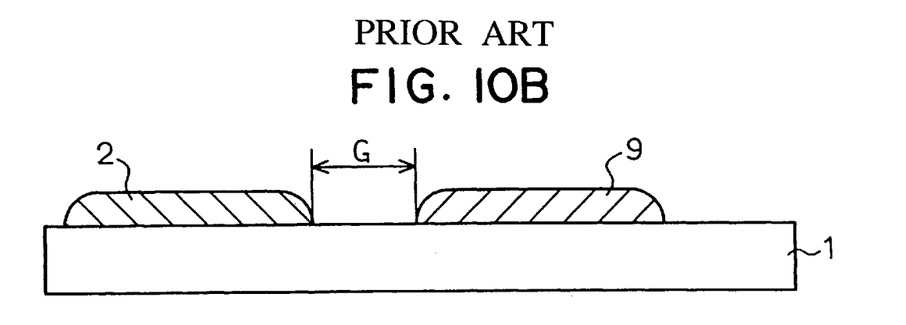
Figure 10C:
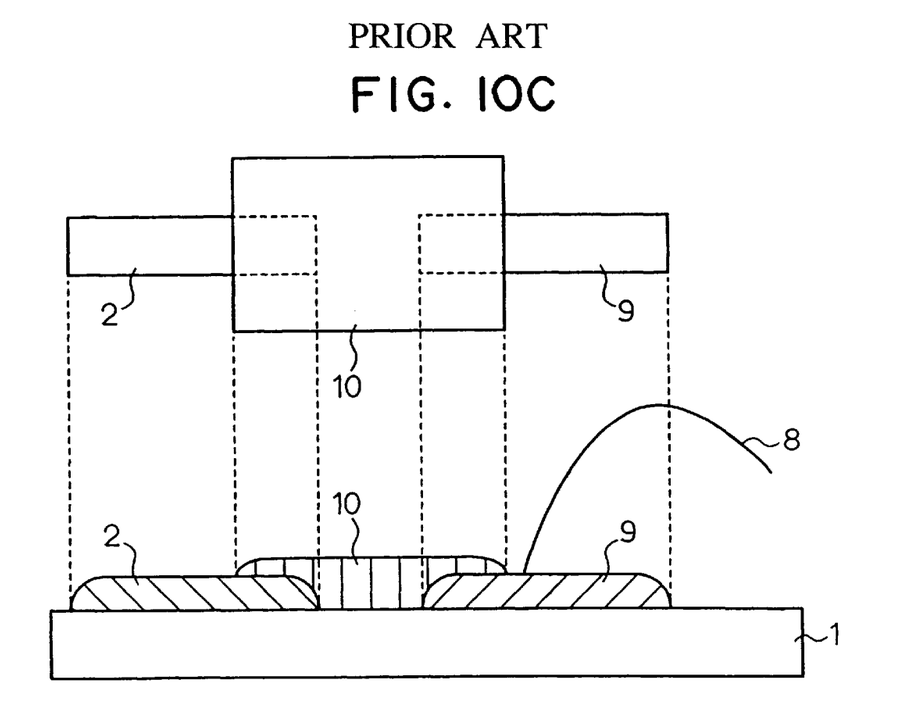

Conventionally, as a counter measure therefor, as exemplified in FIGS. 10A, 10B and 10C, the following structure has been proposed. After forming the copper (Cu) wiring layer 2 as a thick film on the insulating substrate 1 such as a ceramic substrate or the like (FIG. 10A), the gold (Au) thick film land 9 is formed at a position separated from the copper (Cu) wiring layer 2 by a pertinent gap G (FIG. 10B). Thereafter, a connecting portion 10 comprising nickel conductive paste is printed and sintered to partially overlap with each of the copper (Cu) wiring layer 2 and the gold (Au) thick film land 9 thereby electrically connecting the copper (Cu) wiring layer 2 and the gold (Au) thick film land 9 (FIG. 10C). The gold (Au) wire 8 is bonded to the gold (Au) thick film land 9 that is electrically connected to the copper (Cu) wiring layer 2 (FIG. 10C).

In this case, although the above-described disconnection is difficult to occur, the following problems arise. Because misregistration of the printed connecting portion 10, overflow of the nickel conductive paste and the like can happen, as shown by FIG. 10C, the connecting potion 10 needs to be formed larger than the copper (Cu) wiring layer 2 and the gold (Au) thick film land 9 by which flexibility of layout on the circuit board is significantly restricted. Further, the necessity of such a connecting portion 10 creates a hazard in downsizing of and high density arrangement on the circuit board. Moreover, the fabrication steps become complicated and an increase in cost is unavoidable.

Accordingly, the above-described structure involves many problems in practical application.

SUMMARY OF THE INVENTION

The present invention has been carried out in view of such problems and it is an object of the present invention to provide a thick film circuit board capable of maintaining flexibility of layout of a wire bonding electrode and achieving preferably downsizing of and high density arrangement on the thick film circuit board, for example, even in the case where a copper (Cu) wiring layer is used as a conductive wiring layer and a gold (Au) wire is used as a bonding wire.

Also, it is another object of the present invention to provide a method of forming on a thick film circuit board a wire bonding electrode which is capable of stably bonding the copper (Cu) wiring layer and a gold (Au) thick film land.

In order to achieve such objects, in a thick film circuit board according to the present invention, a wire bonding electrode is formed as a thick film on an insulating substrate to at least partially overlap with copper (Cu) wiring layer. A gold (Au) wire is directly bonded to the wire bonding electrode. The wire bonding electrode to which the gold (Au) wire is directly bonded, includes not only at least gold (Au) as its major component but also copper as its component. By providing the wire bonding electrode electrically and mechanically connected to the copper (Cu) wiring layer, not only the flexibility of layout on the thick film circuit board is not restricted but also downsizing of and high density arrangement on the thick film circuit board are facilitated. Further, according to the structure, a portion corresponding to a connecting portion as shown in FIG. 10C does not need to be provided separately. Therefore, the thick film circuit board can be fabricated further inexpensively in cost.

The wire bonding electrode can be formed by gold (Au) thick film previously added with copper (Cu).

The wire bonding electrode may comprise gold (Au) thick film electrode, and the copper (Cu) wiring layer overlapping with the wire bonding electrode may be formed as a thick film of copper (Cu) wiring previously added with gold (Au). Due to this structure, in the process of forming the wire bonding electrode, occurrence of disconnection caused by the Kirkendoll phenomenon can reliably be restrained and therefore, further stable bonding structure between the wire bonding electrode and the copper (Cu) wiring layer can be provided.

When gold (Au) previously added with copper (Cu) or copper (Cu) previously added with gold (Au) is used for the wire bonding electrode or the copper wiring layer, even if mutual diffusion is caused between these metals in the sintering process, the diffusion rates thereof are lowered and cavities caused by the Kirkendoll phenomenon are difficult to produce.

The wire bonding electrode may comprise the gold (Au) thick film electrode which is formed to at least partially overlap with the copper (Cu) wiring layer and the copper (Cu) wiring layer may be formed to have the copper (Cu) thick film layer previously added with gold (Au) only at a portion which the wire bonding electrode substantially overlaps therewith.

According to this structure, when copper (Cu) previously added with gold (Au) is used for the copper (Cu) wiring layer, the portion added with gold (Au) can be restricted to the portion which the wire bonding electrode substantially overlaps therewith. That is, in respect of the copper (Cu) wiring layer, except the portion which the wire bonding electrode substantially overlaps therewith, excellency of the copper (Cu) wiring such as affinity of solder or the like can be maintained. Further, in this case, stable bonding can be realized at least between the gold (Au) wire and the wire bonding electrode made of a gold thick film.

When the copper (Cu) wiring layer is formed to partially overlap with the wire bonding electrode, the wire bonding electrode comprises a gold (Au) thick film electrode which is directly formed on the insulating substrate and the gold (Au) thick film electrode is constituted to have gold (Au) thick film layer previously added with copper (Cu) only at the portion which the copper (Cu) wiring layer overlaps therewith. Also according to such a structure, stable bonding can be realized at least between the gold (Au) wire and the wire bonding electrode while maintaining a stable bonding structure between the wire bonding electrode and the copper (Cu) wiring layer.

A method of forming a wire bonding electrode having the above-described structure on a thick film circuit board includes a step of printing and sintering a copper (Cu) wiring layer on an insulating substrate and a step of printing and sintering a gold (Au) thick film previously added with copper (Cu) on the insulating substrate as a wire bonding electrode to at least partially overlap with the formed copper (Cu) wiring layer. Or, a method of forming a wire bonding electrode on a thick film circuit board may include a step of printing and sintering a copper (Cu) thick film previously added with gold (Au) as a copper (Cu) wiring layer on an insulating substrate and a step of printing and sintering a gold (Au) thick film as a wire bonding electrode on the insulating substrate to at least partially overlap with the formed copper (Cu) wiring layer.

By these methods, occurrence of disconnection caused by the Kirkendoll phenomenon is reliably restricted in the step of sintering the wire bonding electrode and the wire bonding electrode stably bonded to the copper (Cu) wiring layer can be formed.

In these methods, by using gold (Au) previously added with copper (Cu) or copper (Cu) previously added with gold (Au), in sintering the wire bonding electrode, even when mutual diffusion is caused between these metals, the diffusion rates thereof are lowered by which occurrence of cavities caused by the Kirkendoll phenomenon can be restrained as mentioned earlier.

It is to be noted that the order of forming the copper (Cu) wiring layer and the wire bonding electrode may be reversed.

Further, a method of forming a wire bonding electrode on a thick film circuit board may include a step of printing and sintering a copper (Cu) wiring layer on an insulating substrate, a step of printing and sintering a copper (Cu) thick film previously added with gold (Au) partially on the formed copper (Cu) wiring layer, and a step of printing and sintering a gold (Au) thick film as a wire bonding electrode on the insulating substrate to overlap with a portion of the copper (Cu) thick film added with gold (Au). Or, a method of forming a wire bonding electrode on a thick film circuit board may include a step of printing a copper (Cu) wiring layer on an insulating substrate, a step of printing a copper (Cu) thick film previously added with gold (Au) partially on the printed copper (Cu) wiring layer, and a step of simultaneously sintering the printed copper (Cu) wiring layer and the copper (Cu) thick film added with gold (Au), and a step of printing and sintering a gold (Au) thick film as a wire bonding electrode on the insulating substrate to overlap with a portion of the copper (Cu) thick film added with gold (Au).

According to these methods, when copper (Cu) previously added with gold (Au) is used for the copper (Cu) wiring layer, the portion added with gold (Au) can be restricted to the portion which the wire bonding electrode substantially overlaps therewith. Furthermore, the stable bonding resulting in no disconnection or the like is carried out between the copper (Cu) thick film previously added with gold (Au) and the gold (Au) thick film constituting the wire bonding electrode.

It is to be noted that, by adopting the latter one of the above-described two forming methods, one step of the sintering steps can be dispensed with by which the wire bonding electrode can be formed further efficiently.

A method of forming a wire bonding electrode on a thick film circuit board may include a step of printing and sintering a gold (Au) thick film as a wire bonding electrode on an insulating substrate, a step of printing and sintering a gold (Au) thick film previously added with copper (Cu) partially on the formed wire bonding electrode, and a step of printing and sintering a copper (Cu) wiring layer on the insulating substrate to overlap with a portion of the gold (Au) thick film added with copper (Cu). Or, a method of forming a wire bonding electrode may include a step of printing a gold (Au) thick film as a wire bonding electrode on an insulating substrate, a step of printing a gold (Au) thick film previously added with copper (Cu) partially on the printed wire bonding electrode, a step of simultaneously sintering the printed gold (Au) thick film and the printed gold (Au) thick film added with copper (Cu), and a step of printing and sintering a copper (Cu) wiring layer on the insulating substrate to overlap with a portion of the gold (Au) thick film added with copper (Cu).

Also in the above cases, by adopting the latter one of the above-described two forming methods, one step of the sintering steps can be dispensed with by which the wire bonding electrode can be formed further efficiently.

It is preferable in these methods of forming a wire bonding electrode to select an amount of copper (Cu) added to gold (Au) or an amount of gold (Au) added to copper (Cu) to an amount capable of suppressing mutual diffusion of these metals in the sintering step. Thereby, occurrence of disconnection caused by the Kirkendoll phenomenon can precisely be prevented.

In detail, the amount of copper (Cu) added to gold (Au) or the amount of gold (Au) added to copper (Cu) may preferably be 1.5 through 12 weight %. As a result, occurrence of disconnection can sufficiently be prevented. Particularly, it has been confirmed through experiments by the inventors that when a gold (Au) thick film previously added with 1.5 through 12 weight % of copper (Cu) constitutes a wire bonding electrode, the bonding strength to a gold (Au) wire can be maintained necessarily and sufficiently.

It is particularly preferable to make the amount of copper (Cu) added to gold (Au) or the amount of gold (Au) added to copper (Cu) to be 3 through 10 weight %. Thereby, occurrence of disconnection can be prevented further precisely. Particularly, it has been confirmed by experiments by the inventors that when a gold (Au) thick film previously added with 3 through 10 weight % of copper (Cu) constitutes a wire bonding electrode, further strong bonding strength to the gold (Au) wire can be maintained.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PREFERRED EMBODIMENTS

Figure 1:
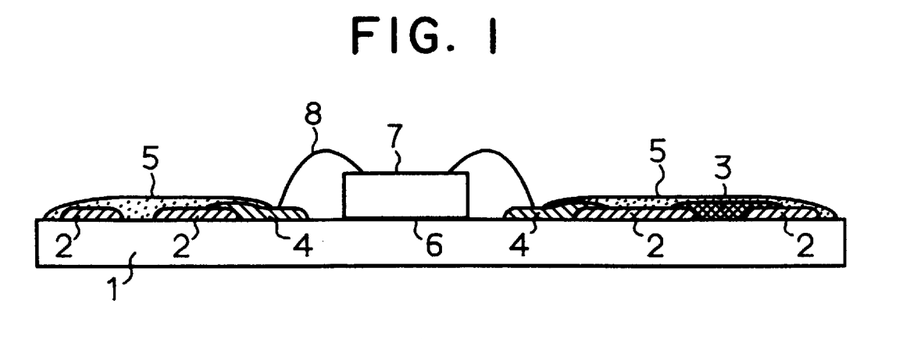
FIG. 1 is a sectional view showing a thick film circuit board according to a first embodiment of the present invention.

FIG. 1 shows a thick film circuit board according to a first embodiment of the present invention. According to the thick film circuit board, as shown by FIG. 1, thick films of copper (Cu) wiring layers 2 are formed on a ceramic substrate 1 as an insulating substrate. A thick film of a resistor 3 of tin oxide ($SnO_2$) family or lanthanum boride ($LaB_6$) family having a desired sheet resistance value is similarly formed between the copper (Cu) wiring layers 2.

The thick film resistor 3 of tin oxide ($SnO_2$) family or lanthanum boride ($LaB_6$) family is provided with an extremely excellent performance as a resistor. Further, in forming the thick film of the resistor 3, the thick film of the resistor 3 as well as the copper (Cu) wiring layers 2 can be sintered under a nitrogen atmosphere. In other words, the thick film of resistor 3 as well as the copper (Cu) wiring layers 2 are provided with an extremely excellent workability as mentioned above.

In the thick film circuit board, a semiconductor part 7 is mounted by being adhered onto the ceramic substrate 1 by an adhesive agent 6. Gold (Au) thick film lands 4 as wire bonding electrodes formed by printing and sintering thick film paste of gold (Au) previously added with copper (Cu), are provided to partially overlap with portions of the copper (Cu) wiring layer 2 which are to be electrically connected to the semiconductor part 7.

Further, as shown by FIG. 1, in the thick film circuit board, the semiconductor part 7 is electrically connected to the copper (Cu) wiring layers 2 by directly bonding the semiconductor part 7 to the gold (Au) thick film lands 4 by the gold (Au) wires 8. As mentioned above, when a mounted part and a wiring layer are electrically connected by such wire bonding, it is most preferable in view of reliability to use the gold (Au) wire 8 as a bonding wire.

In the case of the thick film circuit board according to the first embodiment, as a wire bonding electrode, the gold (Au) thick film land 4 is formed to partially overlap with the copper (Cu) wiring layer 2 by which use and direct bonding of the gold (Au) wire 8 are made possible. Further, in the thick film circuit board of the first embodiment, in forming the gold (Au) thick film land 4, the gold (Au) thick film paste added previously with copper (Cu) is used. As a result, disconnection caused by the Kirkendoll phenomenon is restricted and stable bonding between the copper (Cu) wiring layer 2 and the gold (Au) thick film land 4 is realized.

That is, by the use of the gold (Au) thick film paste added previously with copper (Cu), even if mutual diffusion of metals is caused between the copper (Cu) wiring layer 2 and the gold (Au) thick film land 4 in the sintering process, the diffusion rates are lowered and cavities caused by the Kirkendoll phenomenon is difficult to occur.

Since the direct bonding of the copper (Cu) wiring layer 2 and the gold (Au) thick film land 4 is made possible in this way, arrangement of the connecting portion 10 which was necessary in the thick film circuit board exemplified in FIG. 10C is not needed at all. Therefore, an extremely excellent structure of the thick film circuit board is realized such that:

Flexibility of layout on the thick film circuit board is preferably maintained;

Downsizing of and high density arrangement on the thick film circuit board are facilitated; and The fabrication thereof is facilitated owing to the simple structure and the cost is inexpensive.

Incidentally, according to the thick film circuit board shown by FIG. 1, notation 5 designates a protective film formed by printing and sintering glass paste or the like. The copper (Cu) wiring layers 2, the thick film resistors 3 and portions of the gold (Au) thick film land 4 which are not connected to the mounted part (semiconductor part 7) are protected by the protective films 5.

FIGS. 2A and 2B and FIGS. 3A to 3D show a fabrication process of the thick film circuit board. An explanation will be given of a method of fabricating the thick film circuit board centering mainly on formation of the wire bonding electrode in reference to FIGS. 2A and 2B and FIGS. 3A to 3D.

Figure 2A:
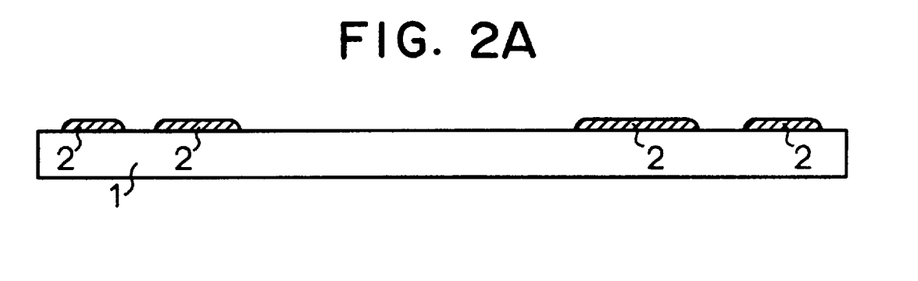
FIGS. 2A and 2B and FIGS. 3A to 3D are sectional views showing a fabrication process of the thick film circuit board according to the first embodiment.

In fabricating the thick film circuit board, firstly, as shown by FIG. 2A, copper (Cu) thick film paste is printed on the ceramic substrate 1 and is dried at 100 through 125° C. and thereafter, sintered at 850 through 950° C. under a nitrogen atmosphere thereby forming copper (Cu) wiring layers 2.

Figure 2B:
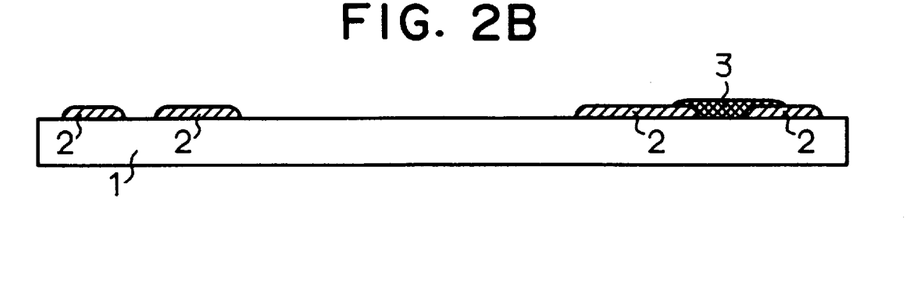

Next, as shown by FIG. 2B, thick film resistor paste of tin oxide ($SnO_2$) family or lanthanum boride ($LaB_6$) family is printed at a desired portion between the formed copper (Cu) wiring layers 2 to respectively overlap with end portions of the copper (Cu) wiring layers 2 by 100 μm or more. The thick film resistor paste is then dried at 100 through 125° C. and thereafter, sintered at 850 through 950° C. under the same nitrogen atmosphere thereby forming a thick film resistor 3.

Figure 3A:
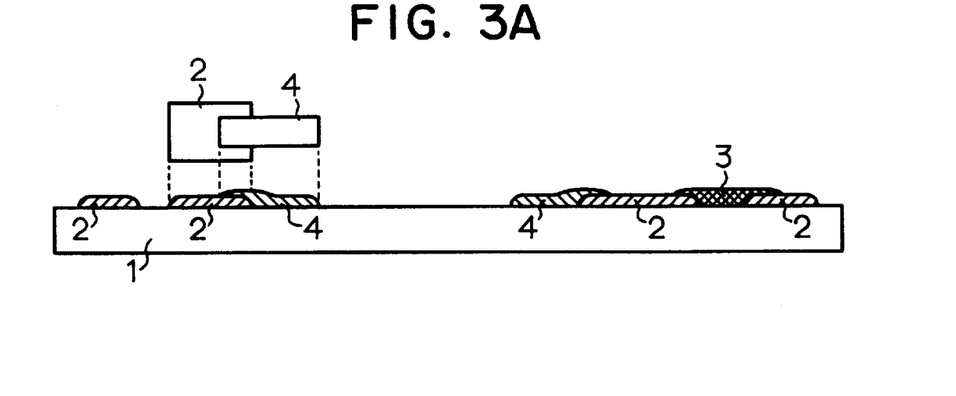

Further, as shown by FIG. 3A, gold (Au) thick film paste previously added with copper (Cu) is printed at vicinities of a portion intended to mount a semiconductor part for the gold (Au) thick film lands 4 to overlap with end portions of the copper (Cu) wiring layers 2 by 100 μm or more. Further, the gold (Au) thick film paste is dried at 100 through 125° C. and sintered at 600° C. or higher under a nitrogen atmosphere thereby forming gold (Au) thick film lands 4 as wire bonding electrodes.

In the above case, a mixture formed into paste by mixing gold powder, copper powder, a glass component and a vehicle by following ratios is used as the gold (Au) thick film paste previously added with copper (Cu).

Gold (Au) powder: 80 weight (weight) %

Copper (Cu) powder: 3 weight %

Glass component as lubricant: 5 weight %

Vehicle constituting volatile solvent: 12 weight %

By using the gold (Au) thick film paste previously added with 3 weight % of copper (Cu) powder to form the gold (Au) thick film lands 4, the above-described disconnection or the like is not caused even with the sintering operation by which a stable bonding between the copper (Cu) wiring layers 2 and the gold (Au) thick film lands 4 can be achieved.

The reason is presumed to be that in sintering process for the gold (Au) thick film paste, although copper (Cu) in the copper (Cu) wiring layers 2 diffuses to the paste, the diffusion rate is lowered since copper (Cu) powder is previously added to the paste per se and so, cavities are difficult to produce by the Kirkendoll phenomenon.

Figure 3B:
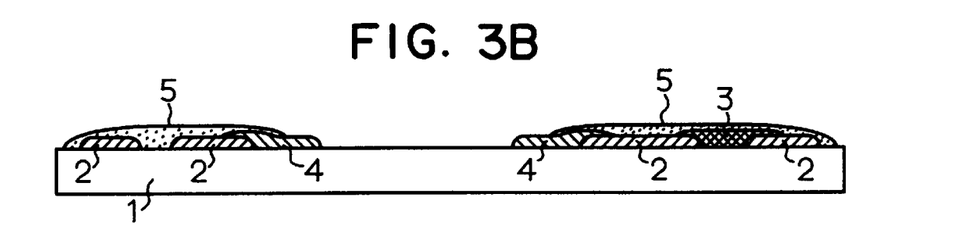

When the gold (Au) thick film lands 4 are formed, next, as shown by FIG. 3B, glass paste is printed at regions on the substrate 1 except for the portions where the semiconductor part is intended to mount and the portions where wire bonding is performed. The glass paste is dried at 100 through 125° C. and is sintered thereafter at 500 through 600° C. under a nitrogen atmosphere thereby forming protective films 5.

Figure 3C:
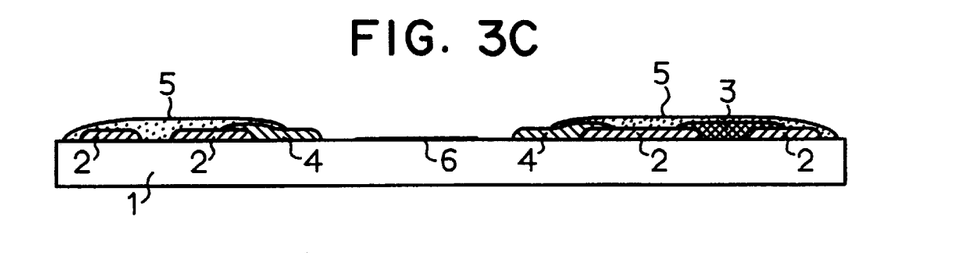
Figure 3D:
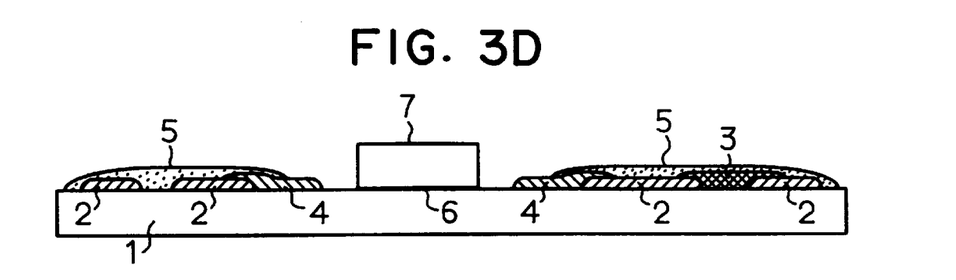

Thereafter, as shown by FIG. 3C, an adhesive agent 6 is coated at a portion on the substrate 1 where the semiconductor part is intended to mount. Further, as shown by FIG. 3D, the assemblage is left under normal temperature through 150° C. in a state where a semiconductor part 7 is mounted on the coated adhesive agent 6, and then the semiconductor part 7 is bonded to the ceramic substrate 1 by curing the adhesive agent 6.

After bonding the semiconductor part 7 to the ceramic substrate 1 in this way, finally, while heating the ceramic substrate 1 from its rear face at 80 through 200° C., gold (Au) wires 8 are directly bonded between the semiconductor part 7 and the gold (Au) thick film lands 4 by a wire bonding process utilizing ultrasonic wave by which the thick film circuit board having the structure shown by FIG. 1 is completed.

According to the film thick circuit board as mentioned above, because the gold (Au) thick film lands 4 are provided as wire bonding electrodes, the gold (Au) wires 8 can be used as bonding wires and directly bonded to the wire bonding electrodes, whereby bonding having high reliability is realized.

In forming the gold (Au) thick film lands 4, the gold (Au) thick film paste previously added with copper (Cu) powder is used by which stable bonding between the copper (Cu) wiring layers 2 and the gold (Au) thick film lands 4 is succeeded.

According to the above-described example, the amount of the copper (Cu) powder added is set to 3 weight %. However, the amount of the copper (Cu) powder added may basically be an amount capable of suppressing mutual diffusion between gold (Au) and copper (Cu) in the sintering process. By previously adding copper (Cu) powder at least by that amount, disconnection of the gold (Au) thick film land 4 caused by the Kirkendoll phenomenon can precisely be restrained.

However, when the amount of the copper (Cu) powder added is excessive, a problem may arise in bonding the gold (Au) wire 8 to the gold (Au) thick film land 4.

Figure 4:
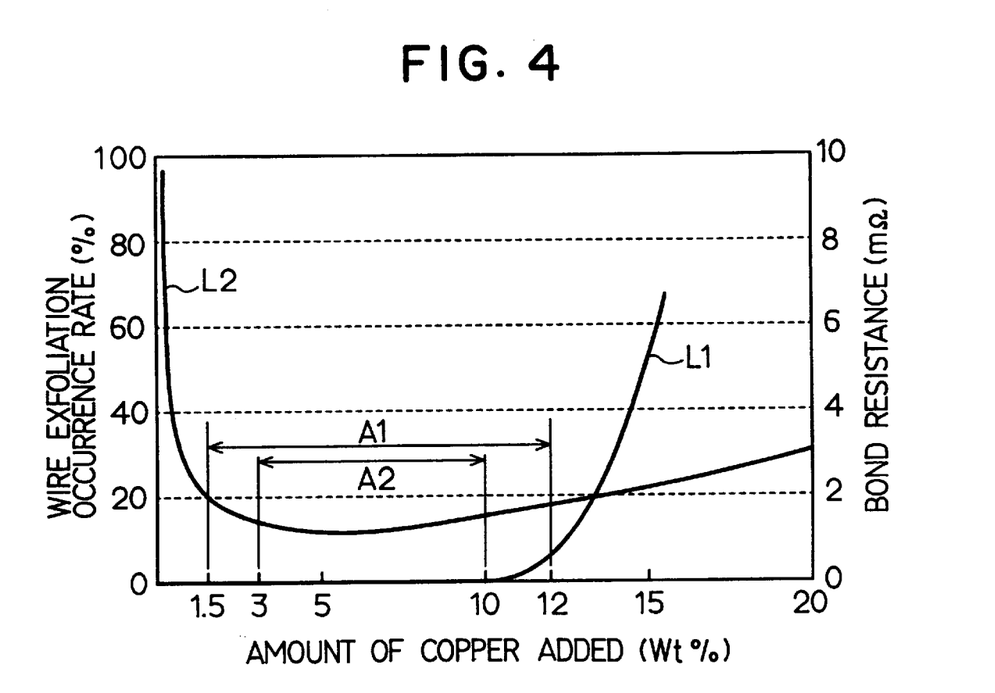
FIG. 4 are graphs showing relationships among an amount of copper (Cu) added to gold (Au), a wire exfoliation occurrence rate and a bond resistance value.

FIG. 4 shows results of experiments conducted by the inventors with respect to a relationship between a wire exfoliation occurrence rate of the gold (Au) wire 8 and the amount of copper (Cu) powder added and a relationship between the bond resistance value between the gold (Au) thick film land 4 and copper (Cu) wiring layer 2 and the amount of copper (Cu) powder added. In FIG. 4, a characteristic line L1 indicates a relationship between the wire exfoliation occurrence rate of the gold (Au) wire 8 and the amount of copper (Cu) added to the gold (Au) thick film paste (gold (Au) thick film land 4). According to the characteristic line L1, the followings are found:

Wire exfoliation does occur when the amount of copper (Cu) powder added is equal to or lower than 10 weight %;

The wire exfoliation occurrence rate is less than 10%, which can be almost disregarded in practical application, when the amount of copper (Cu) powder added is equal to or less than 12 weight %;

When the amount of copper (Cu) powder added exceeds 12 weight %, the wire exfoliation occurrence rate is rapidly increased, which is not allowable in practical application.

In FIG. 4, a characteristic lane L2 indicates a relationship between the bond resistance value between the gold (Au) thick film land 4 and the copper (Cu) wiring layer 2, that is, the bonding performance of these thick films and the amount of copper (Cu) powder added to the gold (Au) thick film paste. According to the characteristic line L2, the followings are found:

When the amount of copper (Cu) powder added is 0 weight %, that is, when there is no addition of copper (Cu), the bond resistance value becomes infinitive, that is, disconnection is caused;

When the amount of copper (Cu) powder added is equal to or more than 1.5 weight %, the bond resistance value between the gold (Au) thick film land 4 and the copper (Cu) wiring layer 2 is 2 through 3 mΩ or lower that is a general resistance value as a wiring material. That is, necessary and sufficient bonding between the gold (Au) thick film land 4 and the copper (Cu) wiring layer 2 can be obtained;

When the amount of copper (Cu) powder added is equal to or more than 3 weight %, the bond resistance value is less than 2 mΩ by which further stable bonding between the gold (Au) thick film land 4 and the copper (Cu) wiring layer 2 can be obtained.

In conclusion, according to the results shown by FIG. 4, the bonding performance between the gold (Au) thick film land 4 and the gold (Au) wire 8 and the bonding performance between the gold (Au) thick film land 4 and the copper (Cu) wiring layer 2 are influenced significantly by the amount of copper (Cu) added to the gold (Au) thick film paste. The result is summarized to establish the following relationships.

(1) Necessary and sufficient bonding between the gold (Au) thick film land 4 and the gold (Au) wire 8 and between the gold (Au) thick film land 4 and the copper (Cu) wiring layer 2 can be provided by setting the amount of copper (Cu) powder added to a range of 1.5 through 12 weight % (range attached with notation A1 in FIG. 4).

(2) Further stable bonding between the gold (Au) thick film land 4 and the gold (Au) wire 8 and between the gold (Au) thick film land 4 and the copper (Cu) wiring layer 2 can be provided by setting the amount of copper (Cu) powder added to a range of 3 through 10 weight % (range attached with notation A2 in FIG. 4).

Incidentally, the copper (Cu) powder adding amount of 3 weight % in the above-described wire bonding electrode forming method is an amount capable of providing further stable bonding between the gold (Au) thick film land 4 and the gold (Au) wire 8 and further, between the gold (Au) thick film land 4 and the copper (Cu) wiring layer 2.

As explained above, according to the thick film circuit board of the first embodiment, the following many excellent effects are achieved.

First, flexibility layout on the thick film circuit board is preferably maintained. Second, downsizing of and high density arrangement on the thick film circuit board are facilitated. Third, the fabrication is facilitated owing to the simple structure and cost is inexpensive. Finally, electrically and mechanically stable bonding is provided at each bonding portion.

Figure 5:
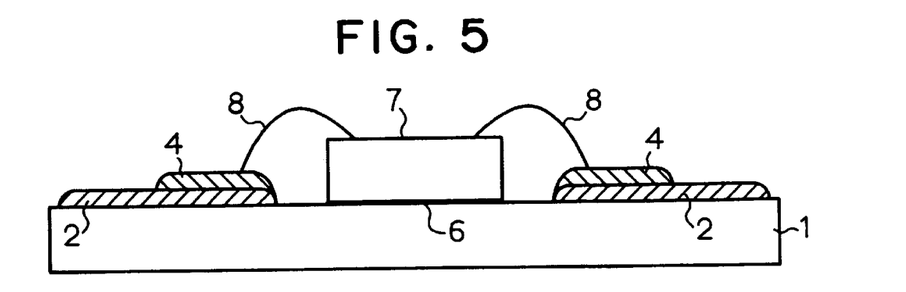
FIG. 5 is a schematic sectional view showing a thick film circuit board according to a second embodiment of the present invention.

According to the first embodiment, the gold (Au) thick film lands 4 were formed to only partially overlap with end portions of the copper (Cu) wiring layers 2. However, as shown in FIG. 5 which illustrates a structure of a second embodiment, the gold (Au) thick film land 4 may be formed so that an entire portion thereof is placed on the copper (Cu) wiring layer 2.

Figure 6:
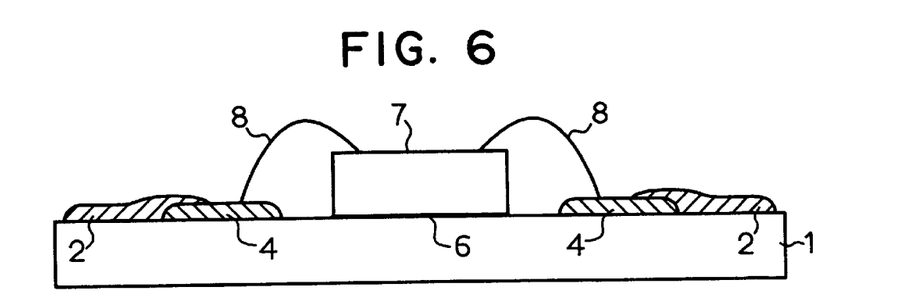
FIG. 6 is a schematic sectional view showing a thick film circuit board according to a third embodiment of the present invention.

Further, according to the first embodiment, the gold (Au) thick film lands 4 were formed to overlap with the copper (Cu) wiring layers 2. However, according to a third embodiment as shown by FIG. 6, the gold (Au) thick film lands 4 are previously formed on the ceramic substrate 1 and the copper (Cu) wiring layers 2 may be formed to partially overlap with the gold (Au) thick film lands 4.

Further, according to the first embodiment, copper (Cu) was previously added to the gold (Au) thick film paste for forming the gold (Au) thick film lands 4. However, the gold (Au) thick film lands may be formed by a gold (Au) thick film paste with no addition of copper (Cu) and a pertinent amount of gold (Au) may be added to the copper (Cu) thick film paste for forming the copper (Cu) wiring layers 2. In this case, the gold (Au) thick film lands 4 per se are formed by the gold (Au) thick film paste and accordingly; no consideration needs to be given to the bonding performance between the gold (Au) wires 8 and the gold (Au) thick film lands 4. Accordingly, the amount of gold (Au) added to the copper (Cu) thick film paste is determined as an amount capable of suppressing mutual diffusion between gold (Au) and copper (Cu) in the sintering process. Also in this case, the above-described range of 1.5 through 12 weight % or a range of 3 through 10 weight % is effective as the amount of gold (Au) added. Occurrence of disconnection or the like caused by the Kirkendoll phenomenon can preferably be restrained at least by previously adding such an amount of gold (Au) powder to the copper (Cu) thick film paste.

When gold (Au) is previously added to the copper (Cu) thick film paste for forming the copper (Cu) wiring layers 2 in this way, there is a concern of deteriorating of function of the copper (Cu) wiring layers 2, for example, affinity of solder or the like. In that case, a structure exemplified in FIG. 7 as a fourth embodiment becomes effective.

Figure 7:
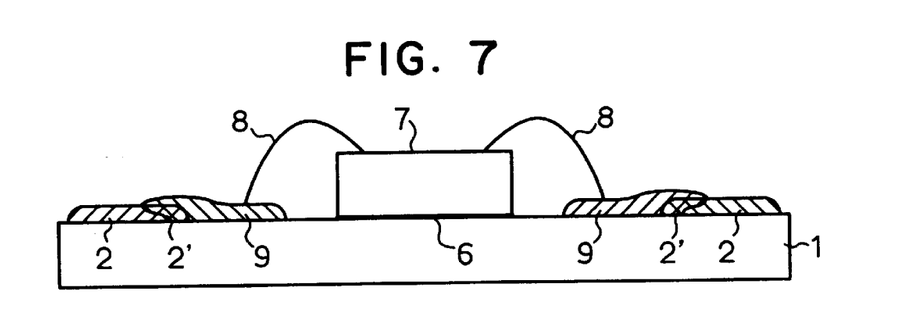
FIG. 7 is a schematic sectional view showing a thick film circuit board according to a fourth embodiment of the present invention.

In FIG. 7, notation 9 designates gold (Au) thick film lands formed by a pure gold (Au) thick film paste and notations 2' designates copper (Cu) thick films in which gold (Au) has previously been diffused and formed only at portions where the gold (Au) thick film lands 9 substantially overlap, in the copper (Cu) wiring layers 2. By adopting such a structure, even when copper (Cu) previously added with gold (Au) is used to form a part of the copper (Cu) wiring layers 2, portions to which gold (Au) is added can be restricted to only portions where the gold (Au) thick film lands 9 constituting the wire bonding electrodes substantially overlap. That is, at the copper (Cu) wiring layers 2, except the portions where the gold (Au) thick film lands 9 overlap, the excellency of a copper (Cu) wire such as affinity of solder or the like is maintained. Further, according to such a structure, at least stable bonding between the gold (Au) wires 8 and the gold (Au) thick film lands 9 can be realized since the gold (Au) thick film lands 9 are formed by the pure gold (Au) thick film paste.

The method of forming the wire bonding electrodes shown in FIG. 7 is as follows.

(1) Copper (Cu) wiring layers 2 are printed on the ceramic substrate 1 and then sintered.

(2) Copper (Cu) thick films 2' previously added with gold (Au) are printed and sintered on each portion of the formed copper (Cu) wiring layers 2.

(3) The gold (Au) thick film lands 9 are printed and sintered on the ceramic substrate 1 as the wire bonding electrodes to overlap with the copper (Cu) thick films 2' added with gold (Au).

Or, the following forming method may be adopted.

(1) The copper (Cu) wiring layers 2 are printed on the ceramic substrate 1.

(2) The copper (Cu) thick films 2' previously added with gold (Au) are printed at each portion of the formed copper (Cu) wiring layers 2.

(3) The printed copper (Cu) wiring layers 2 and the copper (Cu) thick films 2' added with gold (Au) are simultaneously sintered.

(4) The gold (Au) thick film lands 9 are printed and sintered on the ceramic substrate 1 as the wire bonding electrodes to overlap with the copper (Cu) thick films 2' added with gold (Au).

All of the above-described sintering operation is carried out under a nitrogen atmosphere as mentioned before.

Even when the formation of the wire bonding electrodes is carried out by such forming methods, stable bonding resulting in no disconnection or the like is achieved between the copper (Cu) thick films 2' previously added with gold (Au) and the gold (Au) thick film lands 9. Further, by adopting the latter method having the steps of (1) through (4), one step of the sintering steps can be dispensed with by which the formation of the wire bonding electrodes can be carried out further efficiently.

The structure in which copper (Cu) is added to a portion of the gold (Au) thick film land is also effective in the case where the gold (Au) thick film lands constituting the wire bonding electrodes are previously formed on the ceramic substrate and then the copper (Cu) wiring layers are formed to partially overlap with the gold (Au) thick film lands. An example thereof is shown in FIG. 8 as a fifth embodiment.

Figure 8:
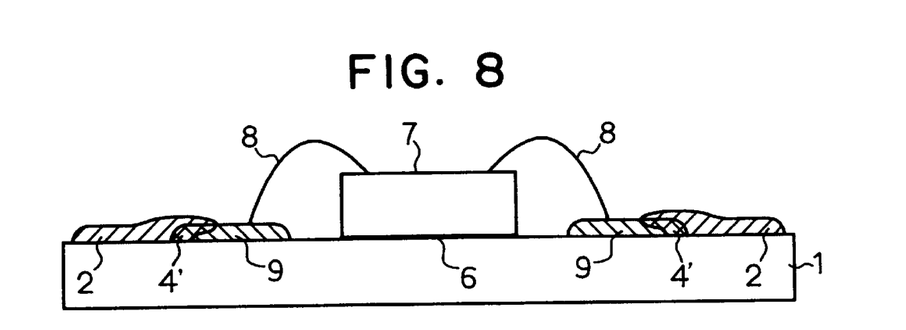
FIG. 8 is a schematic sectional view showing a thick film circuit board according to a fifth embodiment of the present invention.

That is, in FIG. 8, notation 9 designates gold (Au) thick film lands formed by pure gold (Au) thick film paste and notation 4' designates gold (Au) thick films in which copper (Cu) has previously been diffused. The gold (Au) thick films are disposed on the gold (Au) thick film lands 9 and formed at portions where the copper (Cu) wiring layers 2 substantially overlap.

Even with such a structure, further stable bonding can be realized at least between the gold (Au) wires 8 and the wire bonding electrodes 9 while maintaining a stable bonding structure between the wire bonding electrodes 9 (4') and the copper (Cu) wiring layers 2.

The method of forming the wire bonding electrodes shown in FIG. 8 is as follows.

(1) The gold (Au) thick film lands 9 are printed on the ceramic substrate as the wire bonding electrodes and then sintered.

(2) The gold (Au) thick films 4' previously added with copper (Cu) are printed and sintered at each portion of the formed gold (Au) thick film lands 9.

(3) The copper (Cu) wiring layers 2 are printed and sintered on the ceramic substrate 1 to overlap with the gold (Au) thick films 4' added with copper (Cu).

Or, the following forming method may be adopted.

(1) The gold (Au) thick film lands 9 are printed on the ceramic substrate 1 as the wire bonding electrodes.

(2) The gold (Au) thick films 4' previously added with copper (Cu) are printed at each portion of the printed gold (Au) thick film lands 9.

(3) The printed gold (Au) thick film lands 9 and the printed gold (Au) thick films 4' previously added with copper (Cu) are simultaneously sintered.

(4) The copper (Cu) wiring layers 2 are printed and sintered on the ceramic substrate 1 to overlap with the gold (Au) thick films 4' added with copper (Cu).

All of the above-described sintering operation is also carried out under a nitrogen atmosphere.

Even if the wire bonding electrodes are formed by such a forming method, stable bonding resulting in no disconnection or the like is achieved between gold (Au) thick films 4' previously added with copper (Cu) and the copper (Cu) wiring layers 2. Also in this case, by adopting the latter method having the steps of (1) through (4), one step of the sintering steps can be dispensed with, by which the formation of the wire bonding electrodes can further efficiently be carried out.

Incidentally, in either of the structures, or in either of the cases of adopting the methods of forming a wire bonding electrodes, only if the thick films constituting the bonding electrodes are formed on the insulating substrate to at least partially overlap with the copper (Cu) wiring layers 2 and so that the gold (Au) wires 8 are directly bonded thereto, the thick film circuit board with no restriction in flexibility of layout thereon can be obtained. Further, facilitating downsizing of and high density arrangement on the thick film circuit board can be realized. Moreover, the wires utilized in these cases, can connect not only the semiconductor part 7 and the wire bonding electrodes but also the wire bonding electrodes, the wire bonding electrodes and other various electrodes. Therefore, the usage of the wires is further diversified.

What is claimed is:

1. A thick film circuit board comprising:

a copper (Cu) thick film which is formed on an insulating substrate as a wiring layer;

a wire bonding electrode formed on said insulating substrate to be electrically connected to said wiring layer; and a gold (Au) wire directly bonded to said wire bonding electrode to electrically connect said wiring layer and a part mounted on said insulating substrate, wherein said wiring layer and said wire bonding electrode at least partially overlap with one another; and wherein said wire bonding electrode includes both copper (Cu) and gold (Au).

2. The thick film circuit board as recited in claim 1, wherein an amount of Copper (Cu) in said wire bonding electrode is less than that of gold (Au).

3. The thick film circuit board according to claim 2, wherein:

said wire bonding electrode is formed directly on said insulating substrate, and said wire bonding electrode includes both copper (Cu) and gold (Au) only at a portion where said wire bonding electrode and said wiring layer substantially overlap with one another.

4. The thick film circuit board according to claim 2, wherein said amount of copper (Cu) in said wire bonding electrode is in the range of 1.5 through 12 weight percent.

5. The thick film circuit board according to claim 2, wherein said amount of copper (Cu) in said wire bonding electrode is in the range of 3 through 10 weight percent.

6. The thick film circuit board as recited in claim 2, wherein only a first portion of said wire bonding electrode and said wiring layer overlap with one another, and said gold (Au) wire is directly bonded to a second portion of said wire bonding electrode, said second portion being directly disposed on said insulating substrate without interposing said wiring layer therebetween.

7. The thick film circuit board as recited in claim 1, wherein said wiring layer overlaps with said wire bonding electrode.

8. The thick film circuit board as recited in claim 1, wherein said wire bonding electrode overlaps with said wiring layer.

9. The thick film circuit board as recited in claim 1, wherein said wire bonding electrode and said wiring layer are bonded to one another by sintering.

10. The thick film circuit board as recited in claim 1, wherein only a first portion of said wire bonding electrode and said wiring layer overlap with one another, and said gold (Au) wire is directly bonded to a second portion of said wire bonding electrode, said second portion being directly disposed on said insulating substrate without interposing said wiring layer therebetween.

11. A thick film circuit board comprising:

a copper (Cu) thick film which is formed on an insulating substrate as a wiring layer;

a wire bonding electrode formed on said insulating substrate to be electrically connected to said wiring layer; and a gold (Au) wire directly bonded to said wire bonding electrode to electrically connect said wiring layer made of said copper (Cu) thick film and a part mounted on said insulating substrate, wherein said wire bonding electrode and said wiring layer at least partially overlap with one another; and wherein said wiring layer includes gold (Au), an amount of which is smaller than that of copper (Cu).

12. The thick film circuit board according to claim 11, wherein said wiring layer includes gold (Au) only at a portion where said wire bonding electrode and said wiring layer substantially overlap with one another.

13. The thick film circuit board according to claim 11, wherein said amount of gold (Au) in said wiring layer is in the range of 1.5 through 12 weight percent.

14. The thick film circuit board according to claim 11, wherein said amount of gold (Au) in said wiring layer is in the range of 3 through 10 weight percent.

15. The thick film circuit board as recited in claim 11, wherein only a first portion of said wire bonding electrode and said wiring layer overlap one another, and said gold (Au) wire is directly bonded to a second portion of said wire bonding electrode, said second portion being directly disposed on said insulating substrate without interposing said wiring layer therebetween.

16. The thick film circuit board as recited in claim 11, wherein said wiring layer overlaps with said wire bonding electrode.

17. The thick film circuit board as recited in claim 11, wherein said wire bonding electrode overlaps with said wiring layer.

18. The thick film circuit board as recited in claim 11, wherein said wire bonding electrode and said wiring layer are bonded to one another by sintering.

19. The thick film circuit board as recited in claim 11, wherein said wire bonding electrode is mainly made of gold (Au).

20. A thick film circuit board comprising:

a wiring layer including copper (Cu) as a main material and disposed on an insulating substrate;

a wire bonding electrode including gold (Au) as a main material and directly connected to said wiring layer; and a wire including gold (Au) as a main material and directly connected to said wire bonding electrode to electrically connect said wiring layer and a part mounted on said insulating material, wherein at least one of said wiring layer and said wire bonding electrode includes both copper (Cu) and gold (Au).

21. The thick film circuit board as recited in claim 20, wherein said wiring layer and said wire bonding electrode at least partially overlap with one another.

22. The thick film circuit board as recited in claim 21, wherein said wire bonding electrode includes a first portion directly connected to said wiring layer by overlapping, and a second portion directly connected to said wire by bonding.

23. The thick film circuit board as recited in claim 22, wherein said wire bonding electrode and said wiring layer are bonded to one another by sintering.

24. A thick film circuit board comprising:

a thick film made of copper (Cu) which is formed on an insulating substrate as a wiring layer;

a wire bonding electrode formed on said insulating substrate, said wire bonding electrode at least partially overlapping said wiring layer, said wire bonding electrode being formed of copper (Cu) and gold (Au); and a wire made of gold (Au) directly bonded to said wire bonding electrode and electrically connecting said wiring layer and a part mounted on said insulating substrate.

25. The thick film circuit board as recited in claim 24, wherein said wire bonding electrode and said wiring layer are bonded to one another by sintering.

26. A thick film circuit board comprising:

a copper (Cu) thick film formed on an insulating substrate as a wiring layer;

a gold (Au) wire electrically connecting said wiring layer made of said copper (Cu) thick film and a part mounted on said insulating substrate; and a wire bonding electrode formed on said insulating substrate, with which said wiring layer formed by copper (Cu) thick film at least partially overlaps and to which said gold (Au) wire is directly bonded, said wire bonding electrode comprising gold (Au) thick film added with copper (Cu), wherein an amount of copper (Cu) added to said gold (Au) thick film electrode is in the range of 1.5 to 12 weight percent.

27. A thick film circuit board comprising:

a copper (Cu) thick film formed on an insulating substrate as a wiring layer;

a gold (Au) wire electrically connecting said wiring layer made of said copper (Cu) thick film and a part mounted on said insulating substrate; and a wire bonding electrode formed on said insulating substrate, with which said wiring layer formed by copper (Cu) thick film at least partially overlaps and to which said gold (Au) wire is directly bonded, said wire bonding electrode comprising gold (Au) thick film added with copper (Cu), wherein an amount of copper (Cu) added to said gold (Au) thick film electrode is in the range of 3 to 10 weight percent.

28. A thick film circuit board comprising:

a copper (Cu) thick film which is formed on an insulating substrate as a wiring layer;

a gold (Au) wire which electrically connects said wiring layer made of said copper (Cu) thick film and a part mounted on said insulating substrate; and a wire bonding electrode which is formed on said insulating substrate, with which said wiring layer made of copper (Cu) thick film at least partially overlaps and to which said gold (Au) wire is directly bonded, wherein said wiring layer overlapping said wire bonding electrode is formed from a copper (Cu) thick film added with gold (Au), and wherein an amount of gold (Au) added to said copper (Cu) thick film is in the range of 1.5 through 12 weight percent.

29. A thick film circuit board comprising:

a copper (Cu) thick film which is formed on an insulating substrate as a wiring layer;

a gold (Au) wire which electrically connects said wiring layer made of said copper (Cu) thick film and a part mounted on said insulating substrate; and a wire bonding electrode which is formed on said insulating substrate, with which said wiring layer made of copper (Cu) thick film at least partially overlaps and to which said gold (Au) wire is directly bonded, wherein said wiring layer overlapping said wire bonding electrode is formed from a copper (Cu) thick film added with gold (Au), and wherein an amount of gold (Au) added to said copper (Cu) thick film is in the range of 3 through 10 weight percent.

* * * * *